US012191849B2

United States Patent
Osa

(10) Patent No.: US 12,191,849 B2
(45) Date of Patent: Jan. 7, 2025

(54) HIGH-VOLTAGE POWER SUPPLY DEVICE

(71) Applicant: Shimadzu Corporation, Kyoto (JP)

(72) Inventor: Haruki Osa, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 17/951,700

(22) Filed: Sep. 23, 2022

(65) Prior Publication Data

US 2023/0170897 A1    Jun. 1, 2023

(30) Foreign Application Priority Data

Nov. 26, 2021    (JP) ................................. 2021-192026

(51) Int. Cl.
| | |
|---|---|
| H03K 17/567 | (2006.01) |
| H01F 19/04 | (2006.01) |
| H01J 49/10 | (2006.01) |
| H02M 7/217 | (2006.01) |
| H03K 17/06 | (2006.01) |

(52) U.S. Cl.
CPC ........... *H03K 17/567* (2013.01); *H01F 19/04* (2013.01); *H02M 7/217* (2013.01); *H03K 17/063* (2013.01); *H01J 49/10* (2013.01)

(58) Field of Classification Search
CPC .... H03K 17/567; H03K 17/063; H01F 19/04; H02M 7/217; H01J 49/10; H03H 1/00
See application file for complete search history.

(56) References Cited

U.S. PATENT DOCUMENTS

| | | | | |
|---|---|---|---|---|
| 2016/0099650 | A1* | 4/2016 | Yabumoto | ............ H03K 17/601 327/109 |
| 2022/0360219 | A1* | 11/2022 | Shahmohammadi | ........................ H03B 5/1228 |

FOREIGN PATENT DOCUMENTS

| | | | | |
|---|---|---|---|---|
| GB | 2230208 | A * | 10/1990 | ........... H01F 27/323 |
| JP | 6516062 | B2 | 5/2019 | |

* cited by examiner

*Primary Examiner* — Metasebia T Retebo
(74) *Attorney, Agent, or Firm* — Muir Patent Law, PLLC

(57) ABSTRACT

A high-voltage power supply device includes a voltage generation unit for outputting a DC high-voltage, a switching unit using a semiconductor switching element, the switching unit being configured to output an output voltage by the voltage generation unit to a voltage output terminal in a conduction state, a driver for driving a control terminal of the semiconductor switching element, and a controller for controlling the switching unit via the driver. The driver includes a high-frequency transformer provided with primary and secondary windings, a distribution of a stray capacitance per number of unit turns of the primary winding between the primary and secondary windings in an extension direction of the primary winding being symmetrical to a midpoint of the primary winding, a rectifier for rectifying an AC current induced in the secondary winding, and a balanced output type high-frequency excitation unit for exciting the primary winding differentially.

12 Claims, 9 Drawing Sheets

V : 10mV/div
H : 2us/div

V : 10mV/div
H : 2us/div

HIGH-VOLTAGE POWER SUPPLY DEVICE

CROSS-REFERENCE TO RELATED APPLICATIONS

This application claims priority under 35 U.S.C. § 119 to Japanese Patent Application No. 2021-192026 filed on Nov. 26, 2021, the entire disclosure of which is incorporated herein by reference in its entirety.

BACKGROUND OF THE INVENTION

Field of the Invention

The present invention relates to a high-voltage power supply device.

Description of the Related Art

The following description sets forth the inventor's knowledge of the related art and problems therein and should not be construed as an admission of knowledge in the prior art.

In a mass spectrometer, various compounds in a sample are ionized, and the generated ions are separated and detected according to the mass-to-charge ratio (m/z), and the compound is identified or the compound is quantified based on the detection signal. There are two types of compounds, i.e., one that is likely to be positively ionized and the other that is likely to be negatively ionized. For this reason, a gas chromatograph mass spectrometer and a liquid chromatograph mass spectrometer are each generally provided with a function of repeatedly performing measurements while alternately switching between a positive ion measurement mode and a negative ion measurement mode.

Between the positive ion measurement mode and the negative ion measurement mode, it is necessary to switch the polarity of the voltage applied to each constituent element, such as, e.g., an ion source, a mass separator, and an ion detector, of the mass spectrometer. In order to switch between the positive ion measurement mode and the negative ion measurement mode at high speed, the polarity of the applied voltage must be switched at high speed, and therefore, a high-voltage power supply device capable of switching the polarity of the output voltage at high speed is used.

As one such a high-voltage power supply device, the device described in Patent Document 1 is known. The high-voltage power supply device is provided with a positive voltage generation unit, a negative voltage generation unit, discharging diodes, a positive electrode-side high-voltage switch, a negative electrode-side high-voltage switch, and an output capacitor.

The positive voltage generation unit generates a DC high-voltage +HV of positive polarity. The negative voltage generation unit generates a DC high-voltage −HV of negative polarity. The discharging diode is connected so as to be reversely biased by a voltage when the voltage is outputted to the output terminal of the positive/negative voltage generation unit. The positive electrode-side high-voltage switch connects the output terminal of the positive voltage generation unit to the switching voltage output terminal, which is a voltage output terminal of the device when the switch is in a conduction state. The negative electrode-side high-voltage switch connects the output terminal of the negative voltage generation unit to the switching voltage output terminal when the switch is in a conduction state. The output capacitor is connected in parallel to a load to stabilize the potential of the load connected to the switching voltage output terminal.

When outputting a high-voltage of positive polarity to the load, the positive polarity-side high-voltage switch is turned on, and the negative polarity-side high-voltage switch is turned off to thereby set the positive voltage generation unit to an operating state and set the negative voltage generation unit to a stopped state. On the other hand, when outputting a high-voltage of negative polarity to the load, the positive electrode-side high-voltage switch is turned off, the negative electrode-side high-voltage switch is turned on, to thereby set the positive voltage generation unit to a stopped state and set the negative voltage generation unit to an operating state.

In either case, the output capacitor or the like is charged by the power supplied from the positive voltage generation unit or the negative voltage generation unit to the load. When switching the polarity of the output voltage, both the voltage generation units are temporarily made to a stopped state, while both the high-voltage switches are turned on. As a result, the charges accumulated in the output capacitor, a rectifying capacitor included in each voltage generation unit, etc., are released through one of the discharging diodes.

In the above-described high-voltage power supply device, in terms of the circuit, it is simple to use a mechanical relay that can be driven by a direct current as a high-voltage switch. However, a mechanical relay is likely to be defective due to the wear of the mechanical contact or the like, and therefore, it is difficult to ensure high reliability over a long period of time. Further, there is a restriction on the ON/OFF switching speed, which is hard to cope with the speed-up of the polarity switching of the voltage. Furthermore, a circuit design considering chattering bounce is required.

On the other hand, by using a semiconductor switching element, such as, e.g., a power MOSFET (Metal-Oxide-Semiconductor Field-Effect Transistor) and an IGBT (Insulated Gate Bipolar Transistor), as a high-voltage switch, many of the above-described issues can be solved.

[Description of Conventional Gate Drive Circuit]

FIG. 3 is a schematic circuit configuration diagram of a conventional general gate driver.

This gate driver 150 includes an excitation unit 511, a high-frequency transformer 512, a rectifier 505 including rectifying diodes 503 and a rectifying capacitor 504, and a discharging resistor 506.

When the excitation unit 511 is turned on, a high-frequency signal voltage, which is the output of the excitation unit 511, is applied to the primary winding 512a of the high-frequency transformer 512, causing a high-frequency current flow through the primary winding 512a. The AC current induced in the secondary winding 512b of the high-frequency transformer 512 is rectified by the rectifier 505 to charge the rectifying capacitor 504 (and the parasitic capacitance between the gate and the source of the power MOSFET 30). When this charging voltage exceeds the gate threshold voltage of the power MOSFET 30, the power MOSFET 30 is turned on.

When the excitation unit 511 is turned off, the charges accumulated in the rectifying capacitor 504 and the parasitic capacitance are mainly discharged through the discharging resistor 506, thereby turning off the power MOSFET 30.

PRIOR ART DOCUMENT

Patent Document

Patent Document 1: Japanese Patent No. 6516062

SUMMARY OF THE INVENTION

Problems to be Solved by the Invention

In the case of using a semiconductor switching element, a gate drive circuit for turning on/off the semiconductor switching element is required. In a high-voltage power supply device, a high-voltage circuit that handles a voltage of about several hundred volts or higher and a low-voltage circuit for control that handles a voltage of about several volts coexist. For this reason, an insulation-type gate drive circuit is often used for the purpose of, e.g., protecting the low-voltage circuit.

As such a circuit, a gate drive circuit including a transformer, an excitation circuit for exciting a primary winding of the transformer by a high-frequency signal, and a rectifier circuit for rectifying an AC current induced in a secondary winding of the transformer is known. In this gate drive circuit, when a current by the high-frequency signal is supplied from the excitation circuit to the primary winding of the transformer, an AC current is induced in the secondary winding of the transformer. A direct current obtained by rectifying the AC current with the rectifier circuit charges a capacitor (and a parasitic capacitance of the gate, etc.) connected between the gate and the source of the semiconductor switching element. When the charging voltage of the capacitor exceeds the gate threshold voltage of the semiconductor switching element, the semiconductor switching element is turned on.

In a case where a gate drive circuit as described above is used, in some cases, there may be a case in which high-frequency noise derived from the high-frequency signal generated by the excitation circuit is superimposed on the output voltage of the high-voltage power supply device. For example, in a case where such noise is superimposed on a high-voltage applied to an ion injection unit, a flight tube, or the like in a time-of-flight mass spectrometer, there is a possibility that the performance, such as, e.g., the mass resolution and the mass accuracy, may be degraded.

One method of reducing the high-frequency noise appearing in the output voltage is to increase the capacitance of the output capacitor to stabilize the output voltage. However, in the case of increasing the capacitance of the output capacitor, the amount of electric charges for charging/discharging the output voltage when inverting the polarity of the output voltage increases, which in turn may lead to, for example, an increase in the polarity inversion time.

The present invention has been made to solve the above-described problems. It is an object of the present invention to provide a high-voltage power supply device using a semiconductor switching element for a switching operation and/or an on/off operation of an output voltage, the high-voltage power supply device being capable of reducing noise superimposed on the output voltage due to a gate drive circuit of the semiconductor switching element.

Means for Solving the Problems

According to one aspect of the present invention made to solve the above-described problem, a high-voltage power supply device includes:

- a voltage generation unit configured to output a DC high-voltage;
- a switching unit using a semiconductor switching element, the switching unit being configured to output an output voltage by the voltage generation unit to a voltage output terminal when the switching unit is in a conduction state;
- a driver configured to drive a control terminal of the semiconductor switching element in the switching unit; and
- a controller configured to control conduction/non-conduction of the switching unit via the driver, wherein the driver includes:

- a high-frequency transformer provided with a primary winding and a secondary winding, a distribution of a stray capacitance per number of unit turns of the primary winding between the primary winding and the secondary winding in an extension direction of the primary winding being symmetrical to a midpoint of the primary winding;
- a rectifier configured to rectify an AC current induced in the secondary winding of the high-frequency transformer; and
- a balanced output type high-frequency excitation unit configured to excite the primary winding of the high-frequency transformer differentially.

Effects of the Invention

According to the above-described aspect of the high-voltage power supply device according to the present invention, it is possible to suppress common mode noise caused by the excitation of a high-frequency transformer, the common mode noise appearing at the voltage output terminal regardless of the magnitude of the stray capacitance between the primary winding and the secondary winding of the high-frequency transformer. With this, it is possible to reduce the noise caused mainly by the gate drive circuit to be superimposed on the output voltage of the high-voltage power supply device.

Further, there is no need to increase the capacitance of the output capacitor more than necessary, and therefore, it is possible to shorten the time required for switching the polarity of the output voltage and for rising the output voltage. Further, by suppressing the capacitance of the output capacitor, the capacitor can be reduced in size and weight, which in turn is advantageous for reducing the size and weight of the high-voltage power supply device.

In a case where the high-voltage power supply device according to the above-described aspect of the present invention is applied to, for example, a high-voltage power supply device for ion-injection or a flight tube in a time-of-flight mass spectrometer, the noise superimposed on the output voltage can be reduced, which in turn can improve the mass resolution, the mass accuracy, and the like. Further, the capacitance of the output capacitor can be decreased, which makes it possible to shorten the analysis time and perform measurements that can be regarded as substantially simultaneous when performing the measurements by switching between a positive ion measurement mode and a negative ion measurement mode.

BRIEF DESCRIPTION OF THE DRAWINGS

Some embodiments of the present disclosure are shown by way of example, and not limitation, in the accompanying figures.

EMBODIMENTS FOR CARRYING OUT THE INVENTION

Hereinafter, configurations and operations of several embodiments of a high-voltage power supply device according to the present invention will be described in comparison with a device according to a prior art.

[Overall Configuration and Schematic Operation of Polarity Switching High-Voltage Power Supply Device of this Embodiment]

Figure 1:
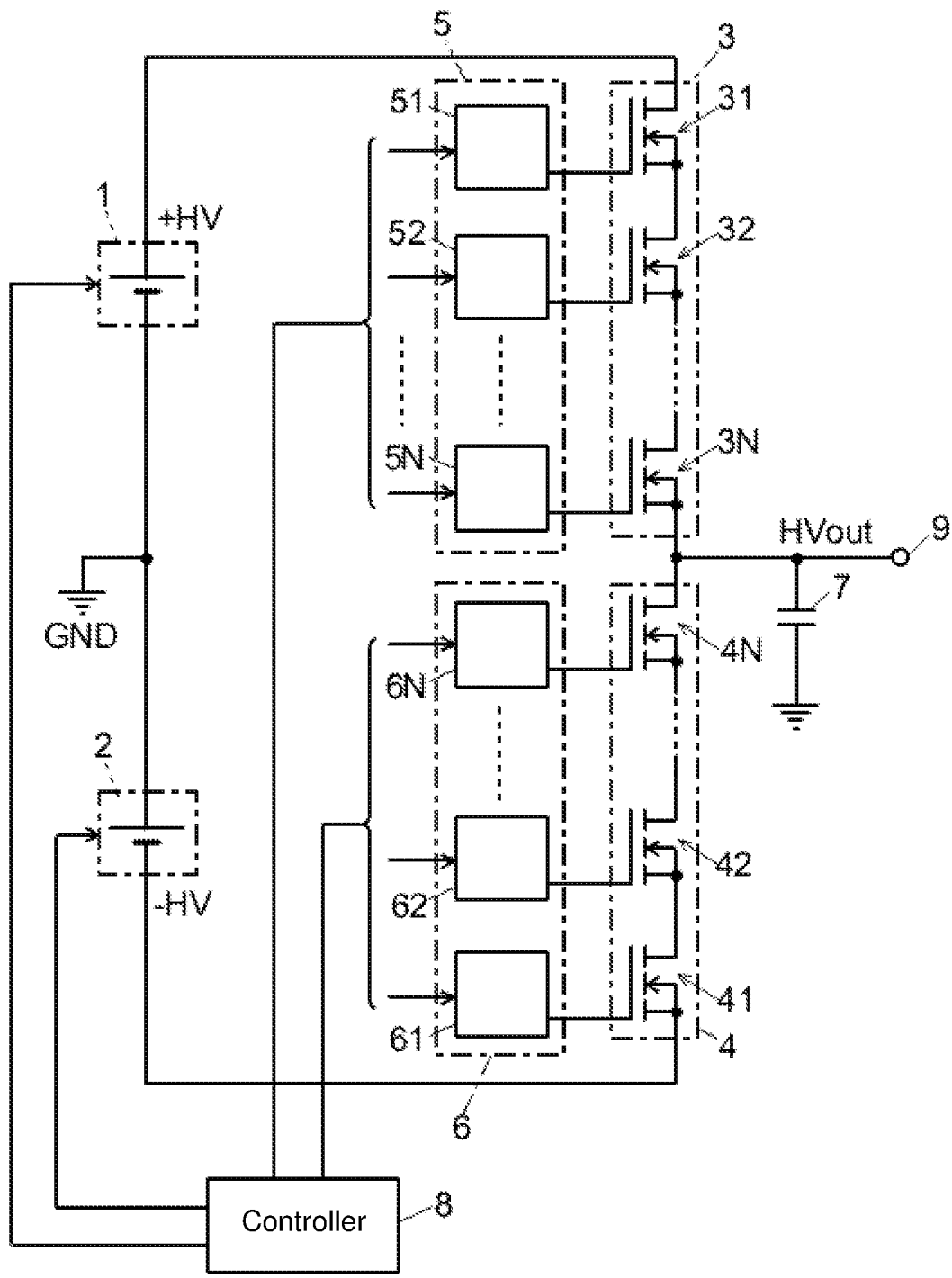
FIG. 1 is a schematic block configuration diagram of a polarity switching high-voltage power supply device, which is one embodiment of the present invention.

FIG. 1 is a schematic block configuration diagram of a polarity switching high-voltage power supply device of this embodiment.

The polarity switching high-voltage power supply device of this embodiment is provided with a positive voltage generation unit 1, a negative voltage generation unit 2, a positive electrode-side high-voltage switching unit 3, a negative electrode-side high-voltage switching unit 4, a positive electrode-side driver 5, a negative electrode-side driver 6, an output capacitor 7, and a controller 8.

The positive voltage generation unit 1 generates a DC high-voltage +HV of positive polarity. The negative voltage generation unit 2 generates a DC high-voltage −HV of negative polarity. The positive electrode-side high-voltage switching unit 3 includes a plurality of power MOSFETs 31-3N. The negative electrode-side high-voltage switching unit 4 includes a plurality of power MOSFETs 41-4N. The positive electrode-side driver 5 and the negative electrode-side driver 6 include a plurality of gate drivers 51-5N and a plurality of gate drivers 61 to 6N, respectively, for driving the plurality of power MOSFETs 31-3N and the plurality of power MOSFETs 41-4N, respectively. The output capacitor 7 is connected between a voltage output terminal 9, which is a connecting end between the positive electrode-side high-voltage switching unit 3 and the negative electrode-side high-voltage switching unit 4, and a ground (GND).

This polarity switching high-voltage power supply device is used to apply a voltage to a mass spectrometer, an electrophoresis device, or the like. The voltage values (absolute values) of the DC high-voltages +HV and −HV are usually 1 kV or higher, or about 400V-500 V at the lowest.

The positive voltage generation unit 1 and the negative voltage generation unit 2 may have any configurations as long as the positive voltage generation unit 1 and the negative voltage generation unit 2 can output a DC high-voltage +HV and a DC high-voltage −HV, respectively, under the control of the controller 8. As one example, each of the positive voltage generation unit 1 and the negative voltage generation unit 2 may be configured as described in Patent Document 1. That is, they may be configured to include an excitation circuit for outputting a high-voltage high-frequency AC signal, a rectifier circuit for converting the high-frequency AC signal into a DC high-voltage, and a filter circuit for removing ripple voltages included in the DC high-voltage.

Further, a discharging diode may be provided so as to be connected in a direction to become a reverse biased state by a voltage outputted to the output terminal of each of the positive voltage generation unit 1 and the negative voltage generation unit 2.

The positive electrode-side high-voltage switching unit 3 and the negative electrode-side high-voltage switching unit 4 are each configured by N pieces of power MOSFETs connected in series. The power MOSFETs 31-3N included in the positive electrode-side high-voltage switching unit 3 are simultaneously turned on/off by the N pieces of the gate drivers 51-5N. The power MOSFETs 41-4N included in the negative electrode-side high-voltage switching unit 4 are simultaneously turned on/off by the N pieces of the gate drivers 61-6N.

The controller 8 controls the voltage-output operations by the positive voltage generation unit 1 and the negative voltage generation unit 2 and also controls the gate drivers 51-5N and 61-61N. With this, the positive electrode-side high-voltage switching unit 3 and the negative electrode-side high-voltage switching unit 4 are respectively turned on/off. The controller 8 may be configured mainly by a microcomputer including, for example, a CPU, a RAM, a ROM, and the like.

In the polarity switching high-voltage power supply device of this embodiment, it is assumed that the positive voltage generation unit 1 is turned on (in an active state), the negative voltage generation unit 2 is turned off (in an inactive state), the positive electrode-side high-voltage switching unit 3 is turned on (in a conductive state), and the negative electrode-side high-voltage switching unit 4 is turned off (in a non-conductive state). At this time, the output voltage HVout of the voltage output terminal 9 is a positive DC high-voltage +HV.

On the other hand, it is assumed that the positive voltage generation unit 1 is turned off, the negative voltage generation unit 2 is turned on, the positive electrode-side high-voltage switching unit 3 is turned off, and the negative electrode-side high-voltage switching unit 4 is turned on. At this time, the output voltage HVout of the voltage output terminal 9 is a negative DC high-voltage −HV. The controller 8 controls on/off operations of the positive voltage generation unit 1 and the negative voltage generation unit 2 and on/off operations of the positive electrode-side high-voltage switching unit 3 and the negative electrode-side high-voltage switching unit 4 according to preset programs. With this, a DC high-voltage of +HV or −HV is outputted to the voltage output terminal 9. At this time, the output capacitor 7 functions to stabilize the potential of a load (not shown) connected to the voltage output terminal 9.

[Problems of Conventional Gate Drive Circuit]

As described above, the gate drivers 51-5N and 61-6N drive the gates (control terminals) of the power MOSFETs 31-3N and 41-4N. Hereinafter, the problems of the gate drive circuit according to the conventional art example of FIG. 3 will be described.

Figure 4:
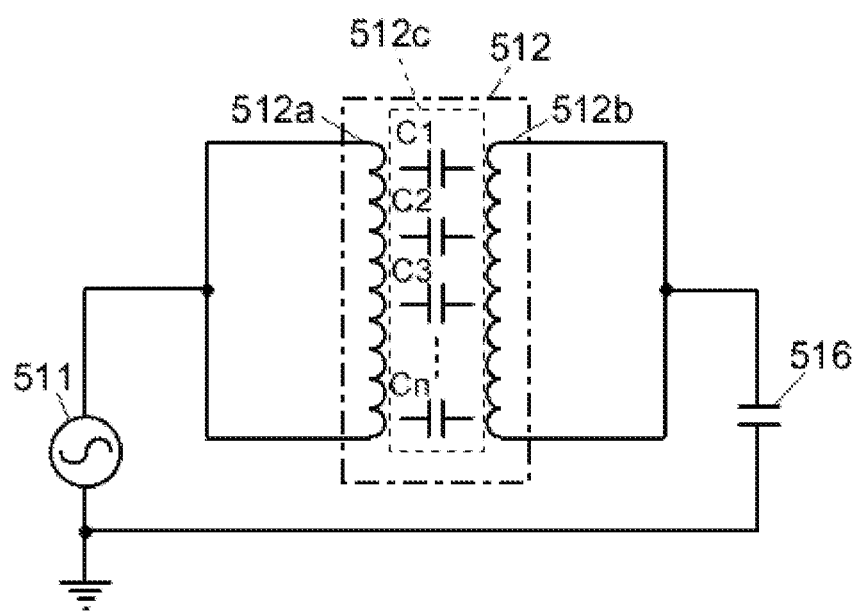
FIG. 4 is an explanatory diagram of a stray capacitance between a primary winding and a secondary winding of a high-frequency transformer.

FIG. 4 is an explanatory diagram of a stray capacitance between the primary winding 512a and the secondary winding 512b of the high-frequency transformer 512 used in the above-described gate driver 150. Between the primary winding 512a and the secondary winding 512b, there exists a stray capacitance 512c corresponding to the sum of the plurality of distributed capacitances C1, C2, . . . , Cn.

As shown in FIG. 4, when an excitation unit 511, which is an unbalanced output type excitation unit, is connected to the primary winding 512a, a common mode current flows the following path, i.e., the excitation unit 511→the primary winding 512a→the stray capacitance 512c→the secondary winding 512b→the secondary ground capacitor 516→ground. As a result, common mode noise corresponding to the common mode current is generated in the secondary ground capacitor 516.

Figure 3:
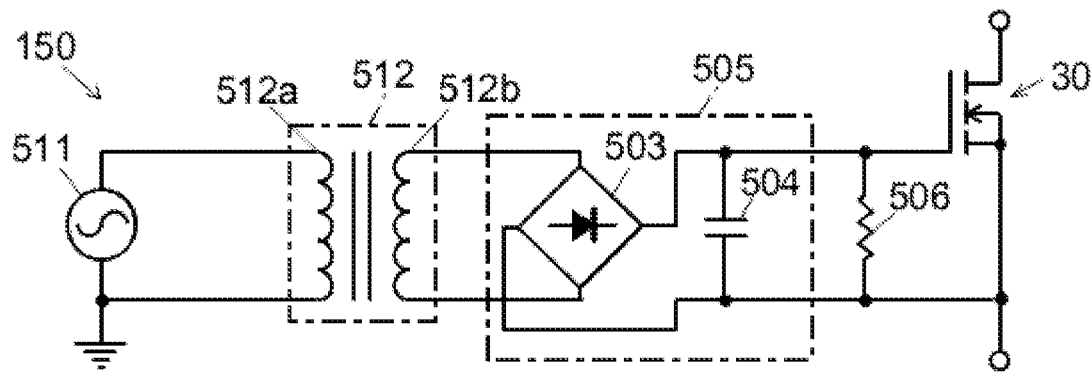
FIG. 3 is a principle schematic configuration diagram of a gate driver using an unbalanced output type excitation unit.

That is, in a case where the gate driver 150 shown in FIG. 3 is applied to the high-voltage power supply device shown in FIG. 1, a common mode current flows through the output node, i.e., the voltage output terminal 9, through the stray capacitance 512c between the primary winding 512a and the secondary winding 512b of the high-frequency transformer 512. Therefore, the common mode noise is further superimposed on the output noise derived from the voltage generation units 1 and 2, resulting in an increase in the noise of the output voltage.

It is now assumed to configure such that the gate driver 150 shown in FIG. 3 is applied to the high-voltage power supply device shown in FIG. 1. In this case, the magnitude of the common mode noise observed at the voltage output terminal 9 is proportional to the amplitude of the excitation signal generated at the excitation unit 511 and the stray capacitance in the high-frequency transformer 512 and is inversely proportional to the capacitance of the output capacitor 7. Therefore, for the purpose of reducing the common mode noise, it is considered to reduce the amplitude of the excitation signal and the stray capacitance of the high-frequency transformer 512 and increase the capacitance of the output capacitor 7.

However, in the case of reducing the amplitude of the excitation signal, it is required to increase the number of turns of the primary winding 512a and the secondary winding 512b of the high-frequency transformer 512 in order to ensure a gate voltage required to keep the power MOSFET 30 in the on-state. However, this leads to an increase in the stray capacitance 512c between the primary winding 512a and the secondary winding 512b. Further, in order to decrease the stray capacitance 512c between the primary winding 512a and the secondary winding 512b, it is considered to increase the separation distance between the primary winding 512a and the secondary winding 512b.

Alternatively, it is considered to arrange an electrostatic shielding between the primary winding 512a and the secondary winding 512b. However, all of the above-described measures lead to an increase in size and cost of the high-frequency transformer 512. On the other hand, when the capacitance of the output capacitor 7 is increased, the amount of the electric charge for charging/discharging the output capacitor 7 at the time of inverting the polarity of the output voltage increases. This may lead to, for example, an increase in the polarity inversion time, as previously described.

[Configuration and Operation of Gate Drive Circuit of this Embodiment]

Figure 2:
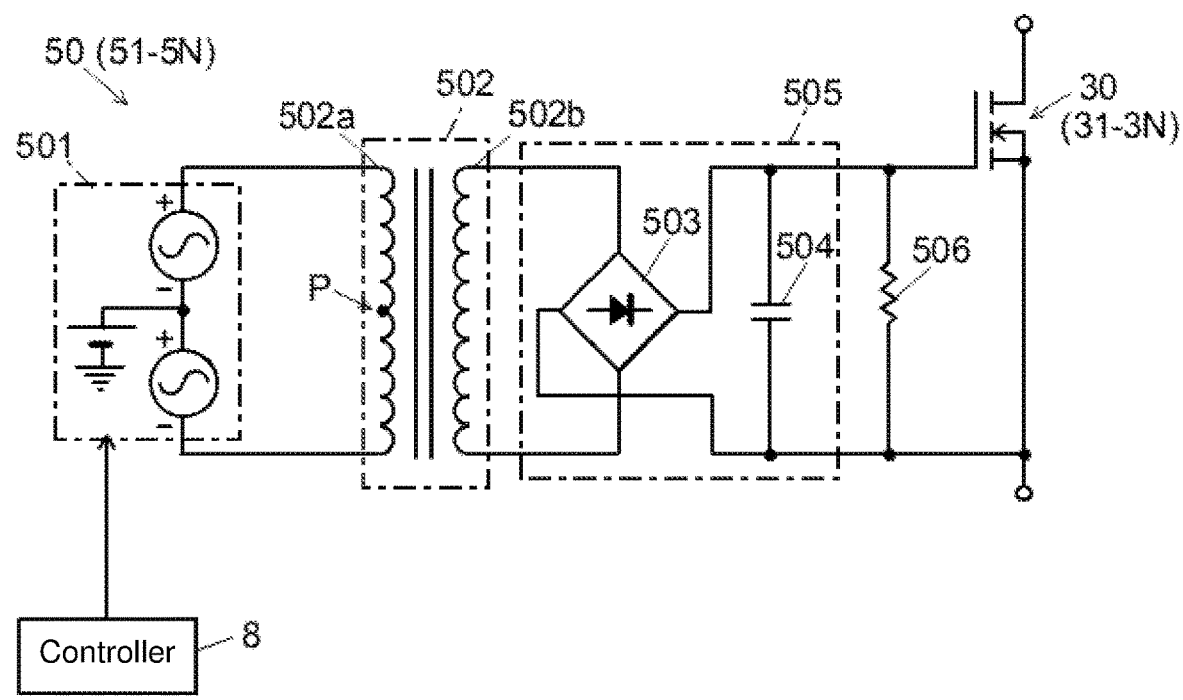
FIG. 2 is a principle schematic configuration diagram of a gate driver in the polarity switching high-voltage power supply device of this embodiment.

FIG. 2 is a principle schematic circuit configuration diagram of the gate driver 51-5N included in the positive electrode-side driver 5 in the polarity switching high-voltage power supply device of this embodiment that can solve the above-described problems. Although not described here, the principle schematic circuit configuration of the gate driver 61-6N included in the negative electrode-side driver 6 is also basically the same. In the high-voltage power supply device shown in FIG. 1, a configuration in which a plurality of power MOSFETs is connected in series is used.

However, in FIG. 2, in the same manner as in FIG. 3, it is assumed to drive a single power MOSFET 30. Accordingly, each of the power MOSFETs 31-3N in FIG. 1 corresponds to the power MOSFET 30 in FIG. 2, and each of the gate drivers 51-5N in FIG. 1 corresponds to the gate driver 50 in FIG. 2. In FIG. 2, the substantially same constituent element as that shown in FIG. 3 is assigned by the same reference numeral. That is, the rectifier 505 and subsequent constituent elements are substantially the same as in this embodiment and a conventional device.

The gate driver 50 includes an excitation unit 501, a high-frequency transformer 502, a rectifier 505 including rectifying diodes 503 and a rectifying capacitor 504, and a discharging resistor 506. The excitation unit 501 is not an unbalanced output type excitation unit shown in FIG. 3 but a balanced output type oscillation circuit that outputs two high-frequency signals in which the wave shapes are inverted to each other (i.e., the polarities are reversed).

Although the detailed structure will be described later, the high-frequency transformer 502 is configured as follows. That is, the distribution of the stray capacitance per number of unit turns of the primary winding 502a between the primary winding 502a and the secondary winding 502b along the extension direction of the primary winding 502a is configured to be symmetrical to the midpoint P of the primary winding 502a. It should be noted that, of course, the symmetry is not necessarily perfect due to manufacturing errors, variations, and the like.

Hereinafter, a high-frequency transformer having such properties will be referred to as a stray capacitance distribution symmetric type high-frequency transformer, and a high-frequency transformer not having such properties will be referred to as a stray capacitance distribution asymmetric type high-frequency transformer.

The two outputs of the excitation unit 501 are connected to both ends of the primary winding 502a of the high-frequency transformer 502. Thus, when the excitation unit 501 is turned on, the excitation unit 501 excites both ends of the primary winding 502a differentially. With this, the AC current induced in the secondary winding 502b of the high-frequency transformer 502 is rectified by the rectifier 505 to charge the rectifying capacitor 504 (and the parasitic capacitance between the gate and the source of the power MOSFET 30). When this charging voltage exceeds the gate threshold voltage of the power MOSFET 30, the power MOSFET 30 is turned on.

When the excitation unit 501 is turned off, the electric charges accumulated in the rectifying capacitor 504 and the parasitic capacitance are mainly discharged through the discharging resistor 506, thereby turning off the power MOSFET 30.

The principle that the common mode noise generated in the output voltage is reduced by using the gate driver 50 having the above-described configuration in the high-voltage power supply device shown in FIG. 1 will be described with reference to FIG. 5.

Figure 5:
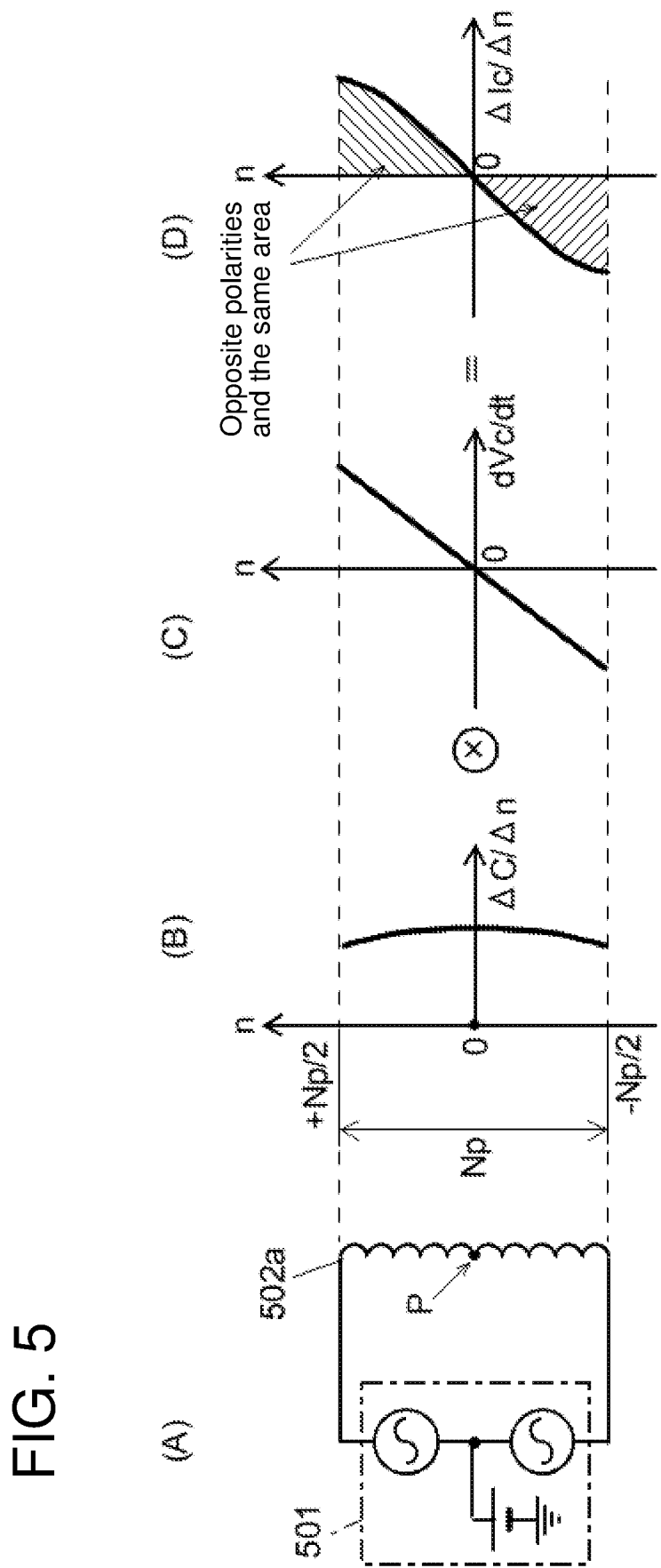
FIG. 5 is a principle explanation diagram (in a case where a primary winding of a high-frequency transformer is independent) of a common mode current flowing through a stray capacitance of a high-frequency transformer included in a gate driver in a polarity switching high-voltage power supply device of this embodiment.

FIG. 5 is a principle explanation diagram of a common mode current flowing through the stray capacitance of the high-frequency transformer 502 in a case where the primary winding 502a of the stray capacitance distribution symmetric type high-frequency transformer 502 is excited by the balanced output type excitation unit 501 differentially (see (A) of FIG. 5).

(B), (C), and (D) of FIG. 5 each show a graph in which the number of turns Np of the primary winding 502a is represented by the Y-axis (vertical axis). Further, the X-axis (horizontal axis) shown in (B) of FIG. 5 represents the stray capacitance (AC/An) per number of unit turns of the primary winding 502a between the primary winding 502a and the secondary winding 502b. The X-axis (horizontal axis) shown in (C) of FIG. 5 represents the instantaneous value (first-order differential value: dVc/dt) of the common mode voltage applied to the primary winding 502a. The X-axis (horizontal axis) shown in (D) of FIG. 5 represents the instantaneous value (first-order differential value: ΔIc/dt) of the common mode current flowing through the stray capacitance.

The common mode current flowing between the primary winding 502a and the secondary winding 502b can be determined as follows. That is, the common mode current can be determined by multiplying each stray capacitance to a minute number of turns of the primary winding 502a by the instantaneous value of the common mode voltage applied to the stray capacitance and integrating the product along the Y-axis (number of turns).

As shown in (B) of FIG. 5, the distribution of the stray capacitance of the primary winding 502a per the number of unit turns between the primary winding 502a and the secondary winding 502b of the high-frequency transformer 502 in the extension direction of the primary winding 502a is symmetrical to the X-axis. Further, as shown in (C) of FIG. 5, the instantaneous value of the common mode voltage applied to the primary winding 502a is a point-symmetric to the origin 0.

Therefore, when the instantaneous value of the common mode current obtained by multiplying both of them is integrated along the Y-axis, it becomes 0 (zero). This is indicated by the fact that, in the graph shown in (D) of FIG. 5, the hatched portion above the X-axis and the hatched portion below the X-axis are opposite in polarity and has the same area. That is, in the gate driver 50, the common mode current is canceled in the high-frequency transformer 502, which makes it possible to avoid generation of common mode noise regardless of the magnitude of the impedance between the secondary winding 502b and the ground.

Figure 6:
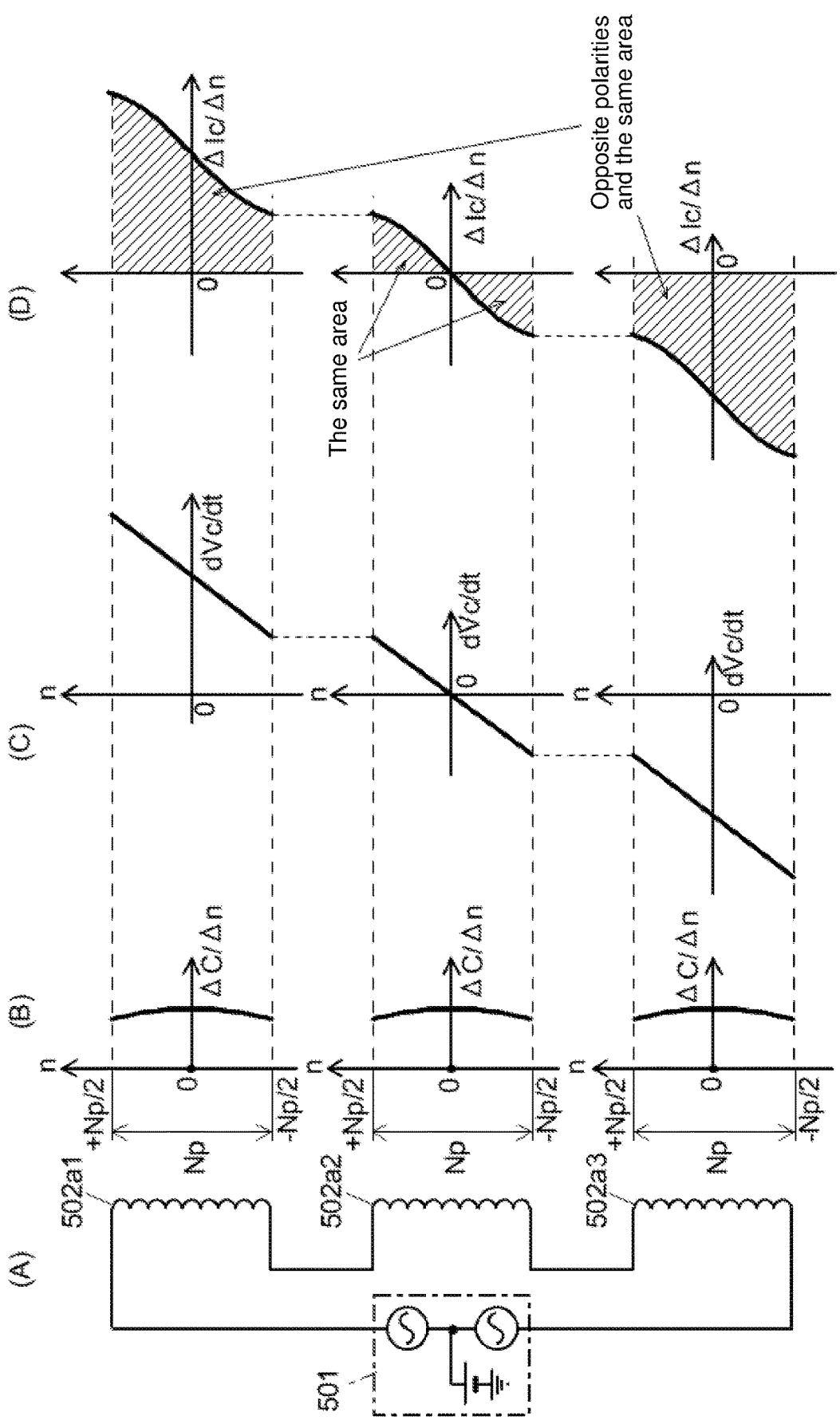
FIG. 6 is a principle explanation diagram (in a case where a plurality of primary windings of high-frequency transformers is connected in series) of a common mode current flowing through a stray capacitance of the high-frequency transformer included in a gate driver in a polarity switching high-voltage power supply device of this embodiment.

As shown in FIG. 1, in a case where one high-voltage switching unit 3, 4 is configured by a plurality of power MOSFETs connected in series, it may be configured as shown in (A) of FIG. 6. That is, the same number of the primary windings of stray capacitance distribution symmetric type high-frequency transformers as that of the power MOSFETs (in the example shown in FIG. 6, three primary windings 502a1, 502a2, and 502a3) are connected in series. Both ends of the series circuit are excited by a single balanced output type excitation unit 501 differentially.

(B) to (D) of FIG. 6 are graphs similar to (B) to (D) of FIG. 5 corresponding to the circuit shown in (A) of FIG. 6. As shown in (B) of FIG. 6, the distribution of the stray capacitance per number of unit turns of the primary winding 502a between the primary winding and the secondary winding in the extension direction of the primary winding 502a in each high-frequency transformer is symmetrical to the X-axis.

As shown in (C) of FIG. 6, the instantaneous value of the common mode voltage applied to the series circuit of the three primary windings 502a1, 502a2, and 502a3 is point symmetric to the origin 0 corresponding to the midpoint of the center located high-frequency transformer. Therefore, when the instantaneous value of the common mode current obtained by multiplying both of them is integrated along the Y-axis, it becomes 0 (zero).

This indicates the fact in (D) of FIG. 6 as follows. That is, in the graph corresponding to the high-frequency transformer located in the center, the hatched portion above the X-axis and the hatched portion below the X-axis are opposite in polarity and have the same area. The hatched portion of the graph located above the center graph and the hatched portion of the graph located below the center graph are opposite in polarity and have the same area.

That is, also in this configuration, the common mode current is canceled, which makes it possible to avoid generation of common mode noise regardless of the magnitude of the impedance between the secondary winding of each high-frequency transformer and the ground, in the same manner as in the case shown in FIG. 5.

Figure 7:
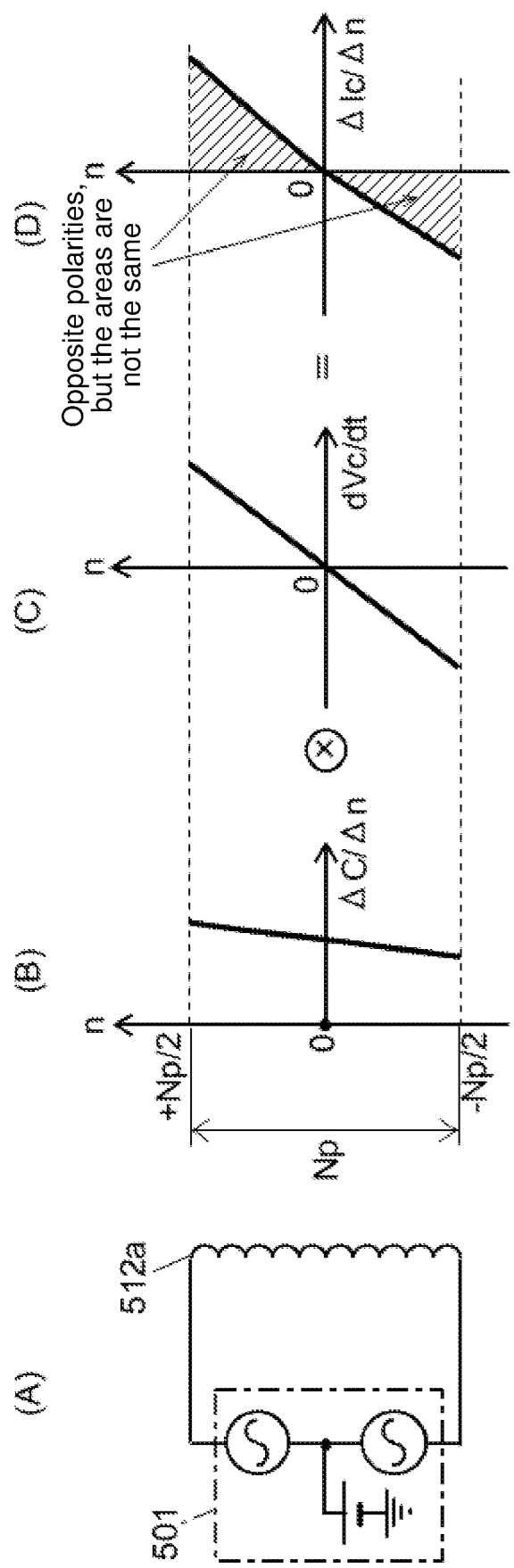
FIG. 7 is an explanatory diagram of a common mode current flowing through a stray capacitance in a case where a distribution of the stray capacitance of a high-frequency transformer is not symmetric to a midpoint of the primary winding.

FIG. 7 is an example for comparing the cases shown in FIG. 5 and FIG. 6. FIG. 7 is a principle explanatory diagram of the common mode current flowing through the stray capacitance of the high-frequency transformer 512 in a case where the primary winding 512a of the stray capacitance distribution asymmetric type high-frequency transformer 512 as used in the configuration shown in FIG. 3 is excited by the balanced output type excitation unit 501 (see (A) of FIG. 7). (B) to (D) of FIG. 7 are graphs similar to (B) to (D) of FIG. 5 corresponding to the circuit shown in (A) of FIG. 7.

As shown in (C) of FIG. 7, the instantaneous value of the common mode voltage applied to the primary winding 512a is point-symmetric to the origin 0. However, as shown in (B) of FIG. 7, the distribution of the stray capacitance per number of unit turns of the primary winding 512a between the primary winding 512a and the secondary winding 512b in the extension direction of the primary winding 502a is asymmetric to the X-axis. Therefore, even if the instantaneous value of the common mode current, which is the product of both of them, is integrated along the Y-axis. It will not become 0 (zero).

This is indicated by the fact that, in the graph shown in (D) of FIG. 7, although the hatched portion above the X-axis and the hatched portion below the X-axis are opposite in polarity but their areas are not equal to each other. That is, unlike the cases shown in FIG. 5 and FIG. 6, the common mode current will not be canceled, thereby causing common mode noise corresponding to the magnitude of the impedance between the secondary winding 512*b* and the ground.

Figure 8:
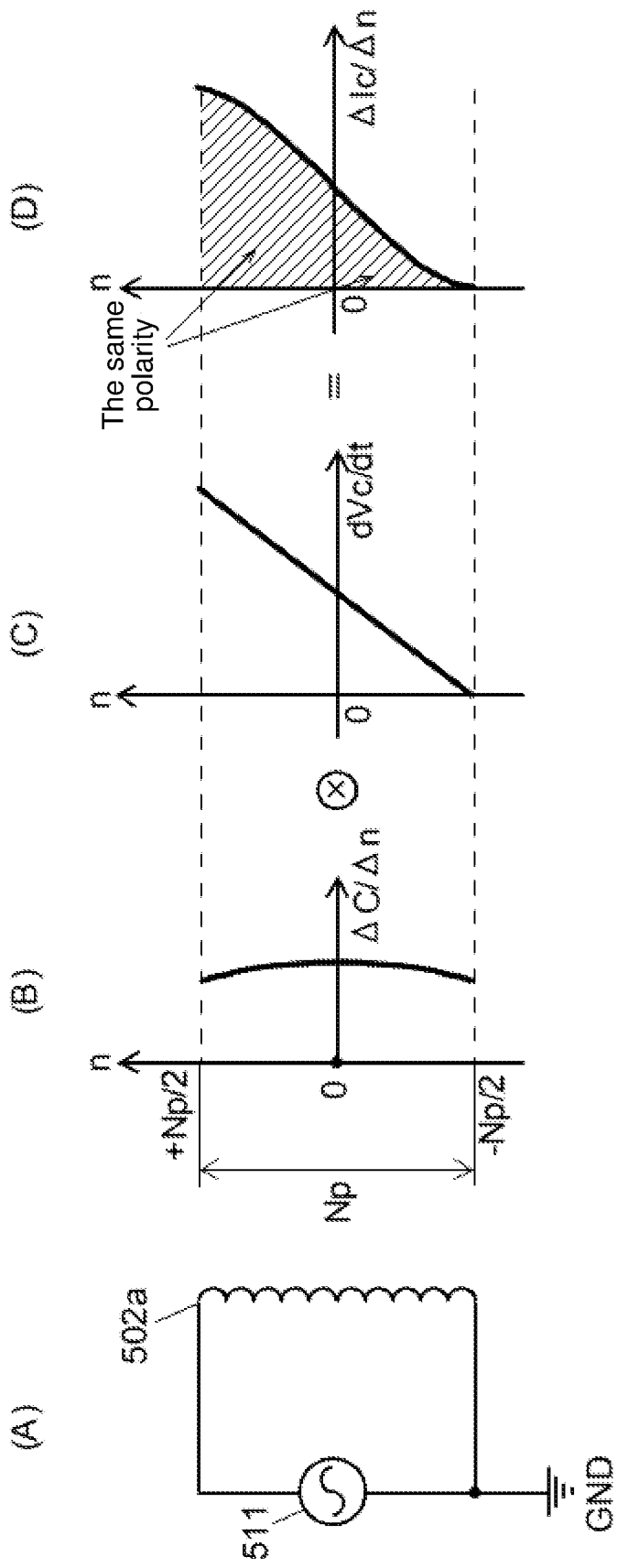
FIG. 8 is an explanatory diagram of a common mode current flowing through a stray capacitance in a case where an unbalanced output type excitation unit is used, and the distribution of a stray capacitance of a high-frequency transformer is symmetric to a midpoint of a primary winding.

On the other hand, FIG. 8 is another example for comparing the cases shown in FIG. 5 and FIG. 6. FIG. 8 is a principle explanatory diagram of the common mode current flowing through the stray capacitance of the high-frequency transformer in a case where the primary winding 502*a* of the stray capacitance distribution symmetric type high-frequency transformer 502 as shown in FIG. 2 is excited by the unbalanced output type excitation unit 511 as used in FIG. 3 (see (A) of FIG. 8). (B) to (D) of FIG. 8 are similar graphs corresponding to (B) to (D) of FIG. 5 corresponding to the circuit shown in (A) of FIG. 8.

As shown in (B) of FIG. 8, the distribution of the stray capacitance per number of unit turns of the primary winding 502*a* between the primary winding 502*a* and the secondary winding 502*b* in the extension direction of the primary winding 502*a* is symmetrical to the X-axis. However, as shown in (C) of FIG. 8, the instantaneous value of the common mode voltage applied to the primary winding 502*a* is not point-symmetrical to the origin 0. Therefore, the instantaneous value of the common mode current, which is the product of both of them, will not become 0 (zero) even if it is integrated along the Y-axis.

This is shown by the fact that in the graph shown in (D) of FIG. 8, the hatched portion above the X-axis and the hatched portion below the X-axis are not opposite in polarity (are the same in polarity). That is, the common mode current will not be canceled, thereby causing common mode noise corresponding to the magnitude of the impedance between the secondary winding 502*b* and the ground.

As is apparent from the above description, in order to avoid or reduce occurrence of common mode noise at the voltage output terminal 9 of the high-voltage power supply device, it is required to configure as follows. That is, as shown in FIG. 2, it is required to use the stray capacitance distribution symmetric type high-frequency transformer 502 as a high-frequency transformer and excite both ends of the primary winding 502*a* differentially by the balanced output type excitation unit 501.

Further, when driving a plurality of power MOSFETs connected in series, it may be configured such that as shown in (A) of FIG. 6, the primary windings 502*a* of a plurality of stray capacitance distribution symmetric type high-frequency transformers 502 are connected in series, and both ends of the series circuit is excited by the balanced output type excitation unit 501 differentially. Of course, the balanced output type excitation unit 501 may be provided for each of the plurality of stray capacitance distribution symmetric type high-frequency transformers 502.

[Specific Example of High-Frequency Transformer]

Figure 9A:
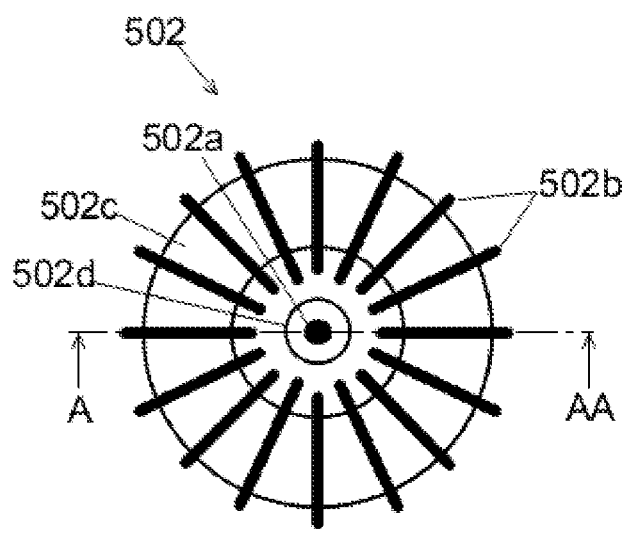
FIG. 9A is a plan view showing one example of a high-frequency transformer in a polarity switching high-voltage power supply device of this embodiment.
Figure 9B:
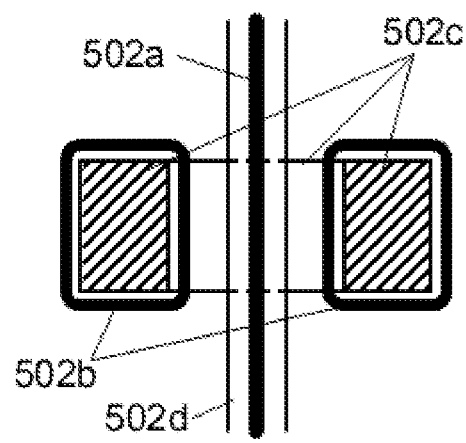
FIG. 9B is a cross-sectional view taken along the line A-AA in FIG. 9A.

FIG. 9A and FIG. 9B each show an example of a specific structure of a stray capacitance distribution symmetric type high-frequency transformer 502, which can be used in the polarity switching high-voltage power supply device according to this embodiment. FIG. 9A is a plan view of the high-frequency transformer 502, and FIG. 9B is a cross-sectional view taken along the A-AA line in FIG. 9A.

In the high-frequency transformer 502, the core 502*c* is formed in a toroidal shape (doughnut shape), and a secondary winding 502*b* is wound around the core 502*c*. Further, a straight primary winding 502*a* covered with an insulating member 502*d* penetrates substantially the center of the opening formed in the center of the core 502*c*, the opening being circular in top view. The number of turns of the secondary winding 502*b* may be appropriately adjusted according to the required voltage, amplitude of the excitation signal, and the like.

In the high-frequency transformer 502 having the above-described structure, it is simple in the structure and it is possible to make the distribution of the stray capacitance of primary winding 502*a* per number of unit turns of the primary winding 502*a* between the primary winding 502*a* and the secondary winding 502*b* in the extension direction of the primary winding 502*a* symmetrical to the midpoint P of the primary winding 502*a*.

It should be noted that the primary winding 502*a* penetrating through the opening may be offset from the center of the opening of the core 502*c* as long as the primary winding 502*a* is not greatly inclined with respect to the center of the core 502*c*. Even in such a case, it is possible to substantially secure the symmetry of the distribution of the stray capacitance of the primary winding 502*a* in the extension direction of the primary winding 502*a*. Further, it should be noted that the specific configuration of the high-frequency transformer 502 is not limited to that shown in FIG. 9.

Measured Examples

Figure 10A:
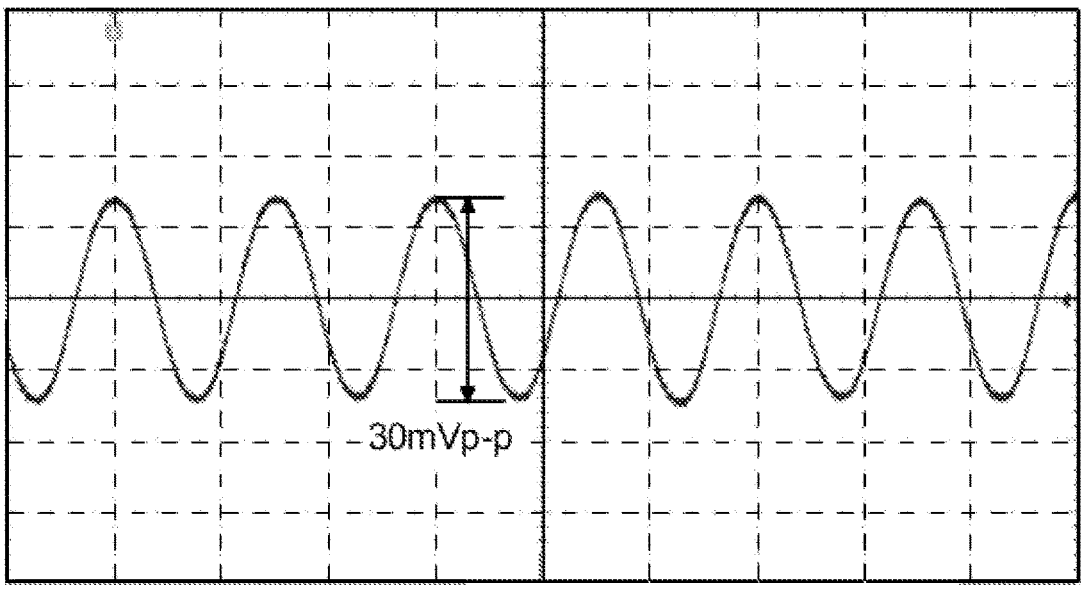
FIG. 10A shows one example of a measured waveform of output noise in a conventional polarity switching high-voltage power supply device.

FIG. 10A shows a measured waveform of noise observed at the voltage output terminal 9 in a prior art. That is, the measured waveform of the noise is observed at the voltage output terminal 9 in a case where in the polarity inversion high-voltage power supply device shown in FIG. 1, ten (10) pieces of power MOSFETs are connected in series for each of the high-voltage switching units 3 and 4, and the primary windings 502*a* of the high-frequency transformers 502 having the structure shown in FIG. 9A and FIG. 9B are connected in series and excited by the unbalanced output type excitation unit 511.

Figure 10B:
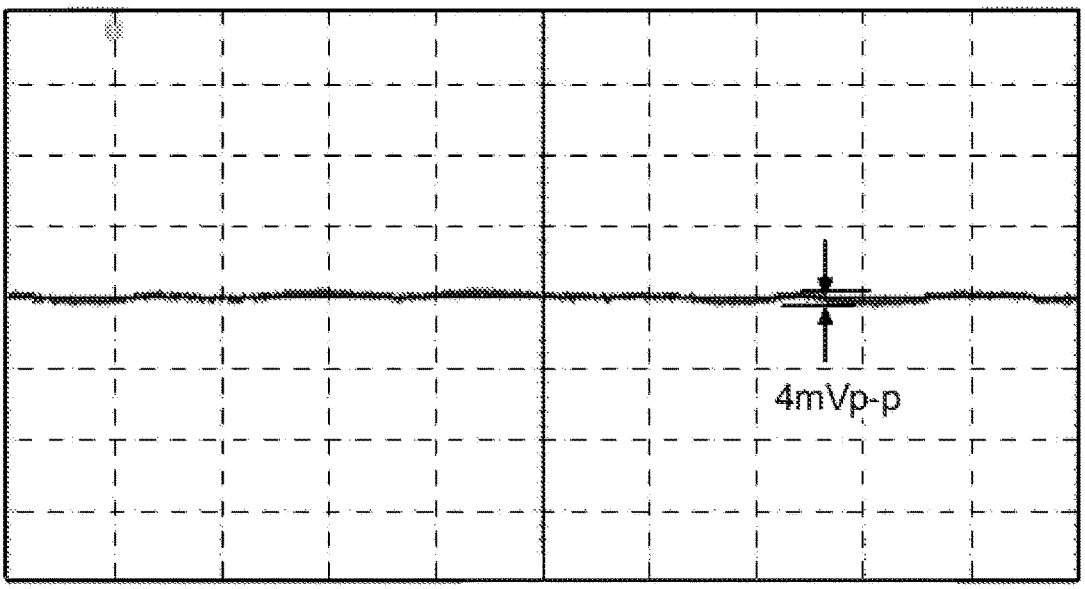
FIG. 10B shows one example of a measured waveform of output noise in a polarity switching high-voltage power supply device of this embodiment.

On the other hand, FIG. 10B shows a measured waveform of noise observed at the voltage output terminal 9 according to one aspect of the present invention. That is, the measured waveform of the noise is observed at the voltage output terminal 9 in a case where in the polarity inversion high-voltage power supply device shown in FIG. 1, ten (10) pieces of power MOSFETs are connected in series for each of the high-voltage switching units 3 and 4, and the primary windings 502*a* of the high-frequency transformers 502 having the structure shown in FIG. 9A and FIG. 9B are connected in series and excited by the balanced output type excitation unit 501. In both cases, the applied voltage to the primary winding 502*a* of the high-frequency transformer 502 was 1.2 Vp-p, the output capacitor 7 was 1 nF, and the exciting frequency of the excitation unit 501 or 511 was 330 kHz.

In FIG. 10A, common mode noise having the exciting frequency was clearly observed, and the amplitude thereof was about 30 mVp-p. In contrast, as shown in FIG. 10B, in the device according to one aspect of the present invention, the amplitude of the common mode noise was reduced to 4 mVp-p, which was reduced to about ⅛ of the case shown in FIG. 10A. In this way, the effectiveness of the high-voltage power supply device according to the above-described embodiment can also be confirmed from the actual measurements.

In the above-described high-voltage power supply devices according to the embodiments, although a power MOSFET is used as a semiconductor switching element constituting the high-voltage switching unit 3, 4, it is obvious that other semiconductor switching element, such as, e.g., IGBT, may be used. Further, it is also obvious that a single power MOSFET or IGBT may be used instead of using a plurality of power MOSFETs or IGBTs connected in series.

Further, it should be noted that the circuits of the high-voltage power supply devices of the embodiments described in FIG. 1, FIG. 2, (A) of FIG. 6, etc., are simplified or equivalent circuits, and various modifications and additions can be made.

It should further be noted that any modifications, additions, and changes may be made appropriately within the scope of the present invention and the scope of the claims.

Various Aspects

It will be appreciated by those skilled in the art that the above-described exemplary embodiments are illustrative of the following aspects.

(Item 1)

A high-voltage power supply device according to one aspect of the present invention includes:
  a voltage generation unit configured to output a DC high-voltage;
  a switching unit using a semiconductor switching element, the switching unit being configured to output an output voltage by the voltage generation unit to a voltage output terminal when the switching unit is in a conduction state;
  a driver configured to drive a control terminal of the semiconductor switching element in the switching unit; and
  a controller configured to control conduction/non-conduction of the switching unit via the driver,
  wherein the driver includes:
  a high-frequency transformer provided with a primary winding and a secondary winding, a distribution of a stray capacitance per number of unit turns of the primary winding between the primary winding and the secondary winding in an extension direction of the primary winding being symmetrical to a midpoint of the primary winding;
  a rectifier configured to rectify an AC current induced in the secondary winding of the high-frequency transformer; and
  a balanced output type high-frequency excitation unit configured to excite the primary winding of the high-frequency transformer differentially.

According to the high-voltage power supply device as recited in the above-described Item 1, it is possible to suppress the common mode noise caused by the excitation of the high-frequency transformer appearing at the voltage output terminal, regardless of the magnitude of the stray capacitance between the primary winding and the secondary winding of the high-frequency transformer. With this, it is possible to reduce the noise caused mainly by the gate drive circuit, the noise being superimposed on the output voltage of the high-voltage power supply device. Further, there is no need to increase the capacitance of the output capacitor more than necessary, and therefore, it is possible to shorten the time required for switching the polarity of the output voltage and for rising the edge of the output voltage. Further, by suppressing the capacitance of the output capacitor, the capacitor can be reduced in size and weight, which is advantageous for reducing the size and weight of the high-voltage power supply device.

(Item 2)

In the high-voltage power supply device as recited in the above-described Item 1, it may be configured such that
  the voltage generation unit includes:
  a first voltage generation unit configured to output a DC high-voltage of positive polarity; and
  a second voltage generation unit configured to output a DC high-voltage of negative polarity, and
  the switching unit includes:
  a first switching unit configured to output an output voltage of the first voltage generation unit to the voltage output terminal when the first switching unit is in a conduction state; and
  a second switching unit configured to output an output voltage of the second voltage generation unit to the voltage output terminal when the second switching unit is in a conduction state.

According to the high-voltage power supply device described in the above-described Item 2, it is possible to output the DC high-voltage of positive polarity and the DC high-voltage of negative polarity from the voltage output terminal while appropriately switching therebetween. This enables the reduction of the noise superimposed on the output voltage.

(Item 3)

In the high-voltage power supply device as recited in the above-described Item 1 or 2, it may be configured such that the switching unit is composed of a plurality of semiconductor switching elements connected in series, and the driver includes a plurality of circuits for driving corresponding control terminals of the plurality of semiconductor switching elements.

According to the high-voltage power supply device described in the above-described Item 3, even in a case where the output voltage is high, a semiconductor switching element with a lower rated voltage can be used. This makes it possible to comprehensively reduce the cost of the device. Further, the output voltage can be increased by using a semiconductor switching element that is easily available.

(Item 4)

In the high-voltage power supply device as recited in any one of the above-described Items 1 to 3, it may be configured such that the high-frequency transformer includes a core of a toroidal shape, a primary winding penetrating through a central opening of the core, and a secondary winding wound around the core.

According to the high-voltage power supply device of the above-described Item 4, with a simple configuration, the distribution of the stray capacitance per number of unit turns of the primary winding between the primary winding and the secondary winding in the extension direction of the primary winding can be made symmetric to the midpoint of the primary winding.

(Item 5)

In the high-voltage power supply device as recited in the above-described Item 3, it may be configured such that the high-frequency transformer includes a core of a toroidal shape, a primary winding penetrating through a central opening of the core, and a secondary winding wound around the core,
  a plurality of primary windings of a plurality of high-frequency transformers respectively corresponding to the plurality of semiconductor switching elements are connected in series, the plurality of primary windings being included in the drivers for driving the corresponding plurality of semiconductor switching elements, and the plurality of primary windings connected in series are excited by the high-frequency excitation unit differentially.

According to the high-voltage power supply device described in the above-described Item 5, even in a case where a large number of semiconductor switching elements are connected in series to form a switching unit, the configuration of the driver can be simplified. As a result, the cost of the device can be reduced, and it is advantageous to reduce the size and weight of the apparatus.

(Item 6)

In the high-voltage power supply device as recited any one of the above-described Items 1 to 5, it may be configured such that the primary winding and the secondary winding of the high-frequency transformer are electrically insulated by an insulating coating of the primary winding.

(Item 7)

In the high-voltage power supply device as recited in any one of the above-described Items 1 to 6, it may be configured such that the semiconductor switching element is either one of a power MOSFET and an IGBT.

DESCRIPTION OF SYMBOLS

1: Positive voltage generation unit
2: Negative voltage generation unit
3: Positive electrode-side high-voltage switching unit
4: Negative electrode-side high-voltage switching unit
  30, 31-3N, 40, 41-4N: Power MOSFET
5: Positive electrode-side driver
  50, 51-5N, 60, 61-6N: Gate driver
  501: Excitation unit
  502: High-frequency transformer
  502a, 502a1, 502a2, 502a3: Primary winding
  502b: Secondary winding
  502c: Core
  502d: Insulating member
  505: Rectifier
  503: Rectifying diode
  504: Rectifying capacitor
  506: Discharging resistor
6: Negative electrode-side driver
7: Output capacitor
8: Control unit
9: Voltage output terminal

The invention claimed is:

1. A high-voltage power supply device comprising:
   a voltage generation unit having a first voltage generation unit configured to output a DC high-voltage of positive polarity and a second voltage generation unit configured to output a DC high-voltage of negative polarity;
   a switching unit using a semiconductor switching element, the switching unit including a first switching unit configured to output the DC high-voltage of positive polarity to a voltage output terminal when the first switching unit is in a conduction state and a second switching unit configured to output the DC high-voltage of negative polarity to the voltage output terminal when the second switching unit is in a conduction state;
   a driver configured to drive a control terminal of the semiconductor switching element in the switching unit; and
   a controller configured to control conduction/non-conduction of the first switching unit and the second switching unit via the driver,
   wherein the driver includes:
   a high-frequency transformer provided with a primary winding and a secondary winding, a distribution of a stray capacitance per number of unit turns of the primary winding between the primary winding and the secondary winding in an extension direction of the primary winding being symmetrical to a midpoint of the primary winding;
   a rectifier configured to rectify an AC current induced in the secondary winding of the high-frequency transformer; and
   a balanced output type high-frequency excitation unit configured to excite the primary winding of the high-frequency transformer differentially.

2. The high-voltage power supply device as recited in claim 1,
   wherein the switching unit is composed of a plurality of semiconductor switching elements connected in series, and
   wherein the driver includes a plurality of circuits for driving corresponding control terminals of the plurality of semiconductor switching elements.

3. The high-voltage power supply device as recited in claim 1,
   wherein the high-frequency transformer includes a core of a toroidal shape, a primary winding penetrating through a central opening of the core, and a secondary winding wound around the core.

4. The high-voltage power supply device as recited in claim 2,
   wherein the high-frequency transformer includes a core of a toroidal shape, a primary winding penetrating through a central opening of the core, and a secondary winding wound around the core.

5. The high-voltage power supply device as recited in claim 2,
   wherein the high-frequency transformer includes a core of a toroidal shape, a primary winding penetrating through a central opening of the core, and a secondary winding wound around the core,
   wherein a plurality of primary windings of a plurality of high-frequency transformers respectively corresponding to the plurality of semiconductor switching elements are connected in series, the plurality of primary windings being included in the drivers for driving the corresponding plurality of semiconductor switching elements, and
   wherein the plurality of primary windings connected in series are excited by the high-frequency excitation unit differentially.

6. The high-voltage power supply device as recited in claim 1,
   wherein the primary winding and the secondary winding of the high-frequency transformer are electrically insulated by an insulating coating of the primary winding.

7. The high-voltage power supply device as recited in claim 1,
   wherein the semiconductor switching element is either one of a MOSFET and an IGBT.

8. The high-voltage power supply device as recited in claim 2,
   wherein the semiconductor switching element is either one of a MOSFET and an IGBT.

9. The high-voltage power supply device as recited in claim 3,
   wherein the semiconductor switching element is either one of a MOSFET and an IGBT.

10. The high-voltage power supply device as recited in claim 4,
  wherein the semiconductor switching element is either one of a MOSFET and an IGBT.

11. The high-voltage power supply device as recited in claim 5,
  wherein the semiconductor switching element is either one of a MOSFET and an IGBT.

12. The high-voltage power supply device as recited in claim 6,
  wherein the semiconductor switching element is either one of a MOSFET and an IGBT.

* * * * *